(12) United States Patent
Fuse

(10) Patent No.: US 11,348,822 B2
(45) Date of Patent: May 31, 2022

(54) SUPPORT SUBSTRATE, METHOD FOR PEELING OFF SUPPORT SUBSTRATE, AND METHOD FOR MANUFACTURING SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kaori Fuse, Yokohama Kanagawa (JP)

(73) Assignees: KABUSHI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 16/797,886

(22) Filed: Feb. 21, 2020

(65) Prior Publication Data

US 2021/0090934 A1 Mar. 25, 2021

(30) Foreign Application Priority Data

Sep. 19, 2019 (JP) .............................. JP2019-170551

(51) Int. Cl.
*H01L 21/683* (2006.01)
*C09J 7/20* (2018.01)

(52) U.S. Cl.
CPC ............ *H01L 21/6836* (2013.01); *C09J 7/20* (2018.01); *C09J 2203/326* (2013.01);
(Continued)

(58) Field of Classification Search
CPC ....... H01L 21/6836; H01L 2221/68318; H01L 2221/68386; H01L 21/6835;
(Continued)

(56) References Cited

U.S. PATENT DOCUMENTS 2,764,501 A * 9/1956 Perri .......................... C09J 7/22
428/43
4,609,964 A * 9/1986 Sobel ....................... G11B 5/82
360/135
(Continued)

FOREIGN PATENT DOCUMENTS

JP 3242452 B2 12/2001
JP 2009175587 A 8/2009
(Continued)

*Primary Examiner* — Patricia L. Nordmeyer
(74) *Attorney, Agent, or Firm* — Kim & Stewart LLP

(57) ABSTRACT

A method of separating a support substrate and a wafer adhered to the support substrate includes inserting a trigger member into a space between the support substrate and the wafer. The space opens on a gap region of the support substrate. The gap region is within an outer periphery of a base member of the support substrate. The base member has an adhesive layer contacting the wafer. The adhesive layer does not extend to an edge of the base member facing the gap region at the space. The wafer and the base member are contacted by the trigger member which promotes separation of the wafer and the support substrate from each other.

15 Claims, 12 Drawing Sheets

(52) U.S. Cl.
CPC ........ *C09J 2301/16* (2020.08); *C09J 2301/18* (2020.08); *H01L 2221/68318* (2013.01); *H01L 2221/68386* (2013.01); *Y10T 428/24273* (2015.01)

(58) Field of Classification Search
CPC ................ H01L 2221/6839; C09J 7/20; C09J 2203/326; C09J 2301/16; C09J 2301/18; Y10T 428/24273; Y10T 428/28; Y10T 428/14
See application file for complete search history.

(56) References Cited

U.S. PATENT DOCUMENTS

| | | |
|---|---|---|
| 5,397,713 A | 3/1995 | Hamamoto et al. |
| 8,882,096 B2 | 11/2014 | Nakamura et al. |
| 2007/0048481 A1* | 3/2007 | Melvin ................... B44C 1/105 428/40.1 |
| 2009/0190118 A1 | 7/2009 | Fukuhara |
| 2016/0233176 A1 | 8/2016 | Kato |

FOREIGN PATENT DOCUMENTS

| | | |
|---|---|---|
| JP | 4922752 B2 | 4/2012 |
| JP | 2014017284 A | 1/2014 |
| JP | 2016146429 A | 8/2016 |
| JP | 2017092194 A | 5/2017 |
| JP | 2018006613 A | 1/2018 |

\* cited by examiner

SUPPORT SUBSTRATE, METHOD FOR PEELING OFF SUPPORT SUBSTRATE, AND METHOD FOR MANUFACTURING SEMICONDUCTOR DEVICE

CROSS-REFERENCE TO RELATED APPLICATION

This application is based upon and claims the benefit of priority from Japanese Patent Application No. 2019-170551, filed Sep. 19, 2019, the entire contents of which are incorporated herein by reference.

FIELD

Embodiments described herein relate generally to a support substrate, a method for removing the support substrate, and a method for manufacturing a semiconductor device.

BACKGROUND

In recent years, the semiconductor wafers used in semiconductor device manufacturing have become ultra-thin while diameter of the semiconductor wafer has become larger. In order to prevent such a semiconductor wafer from cracking during processing steps, a support substrate can be bonded to the semiconductor wafer to support the semiconductor wafer during manufacturing processes of the semiconductor device. The support substrate subsequently is removed (often referred to as being "peeled off") from the semiconductor wafer after completion of the processing.

DETAILED DESCRIPTION

Figure 1:
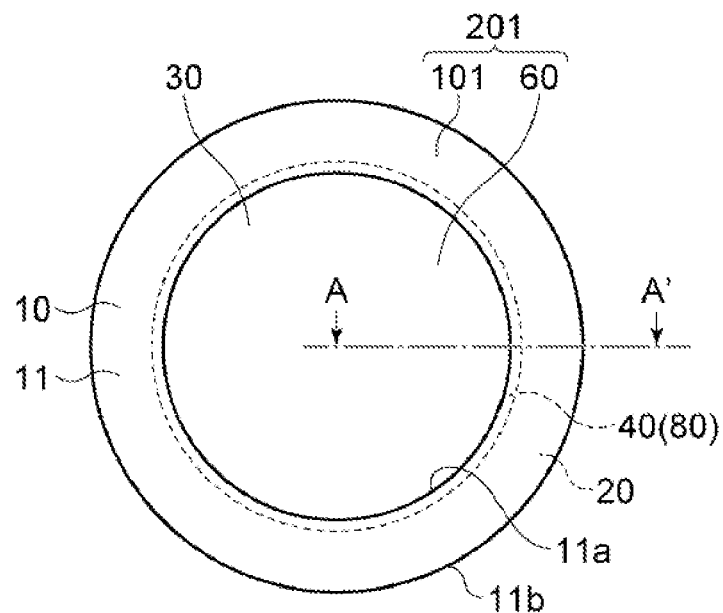
FIG. 1 is a plan view of a structure according to a first embodiment.

In general, according to one embodiment, a method of separating a support substrate and a wafer adhered to the support substrate includes inserting a trigger member into a space between the support substrate and the wafer. The space opens on a gap region of the support substrate. The gap region is formed within an outer periphery of a base member of the support substrate. The base member has an adhesive layer contacting the wafer. The adhesive layer does not extend to an edge of the base member adjacent to the gap region at the space. The wafer and the base member are contacted with the trigger member which separates the wafer and the support substrate from each other.

Hereinafter, certain example embodiments of the present disclosure will be described with reference to the drawings.

The drawings are schematic and/or conceptual, and, in general, the depicted relationships between thickness and width of each portion, a size ratio between different portions, and the like are not necessarily the same as those in an actual device. Even when the same portion is shown in different figures, dimensions and ratios for the portion in the drawings may be different from each other.

In the present disclosure and the drawings thereof, the elements or aspects which are the same as those already described by reference to a previous drawing are denoted using the same reference numerals, and repeated description thereof may be omitted as appropriate.

First Embodiment

Figure 2:
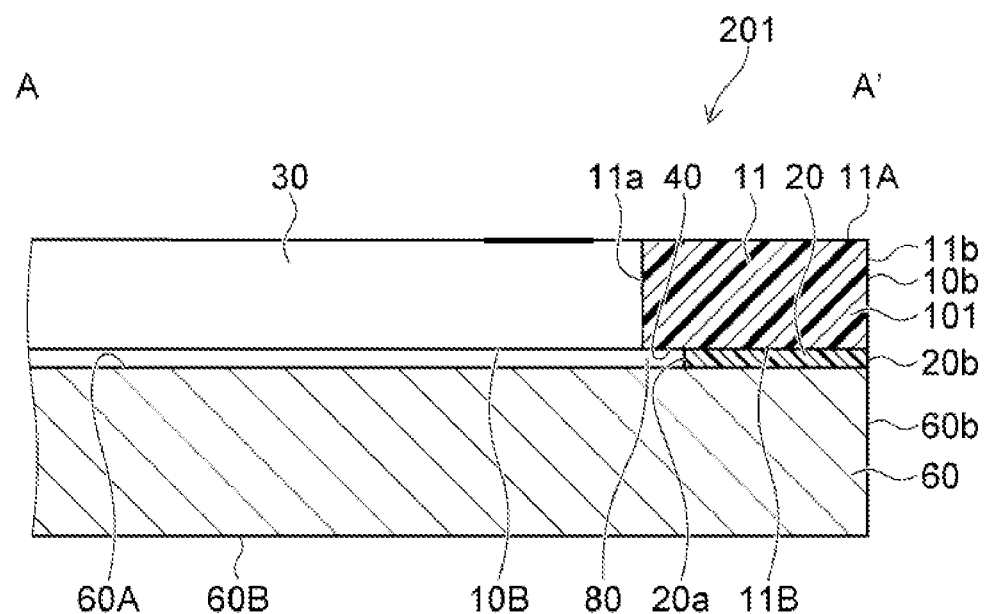
FIG. 2 is a cross-sectional view taken along line A-A' in FIG. 1.

FIG. 1 is a plan view showing a wafer bonded to a support substrate according to a first embodiment. FIG. 2 is a cross-sectional view taken along a line A-A' shown in FIG. 1.

When manufacturing a semiconductor device, a plurality of semiconductor devices are formed on one semiconductor wafer, and the semiconductor devices are then later diced from the wafer and packaged into separate semiconductor devices.

In recent years, with semiconductor wafers being ultra-thinned and diameter of the semiconductor wafer being made larger, warping or cracking of the wafer is more likely to occur. Therefore, the semiconductor wafer may be supported by a support substrate to prevent cracking during processing or transportation. That is, the support substrate is bonded to the semiconductor wafer while the semiconductor wafer is being processed and transported.

As shown in FIGS. 1 and 2, a support substrate 101 according to the present embodiment includes a base member 10 and an adhesive layer 20. A structure 201 (collective structure) includes the support substrate 101 and a wafer 60. The base member 10 is bonded to the wafer 60 by the adhesive layer 20. The structure 201 is generally a disk shape. In the following description, a direction going from the wafer 60 towards the support substrate 101 in a thickness direction of the structure 201 is referred to as an "upward" or "upper" direction and a direction going from the support substrate 101 towards the wafer 60 is referred to as a "lower" direction for convenient description. A direction from the center towards an outer edge of the structure 201 is referred to as a "radial direction" and a direction along the outer edge (perimeter) is referred to as a "circumferential direction" as viewed from an upper side.

The base member 10 has an annular shape having an outer diameter approximately equal to an outer diameter of the wafer 60. The base member 10 includes a first annular portion 11. A gap 30 penetrating through the base member 10 in the thickness direction is formed on an inner radial side of the first annular portion 11. Surfaces of the first annular portion 11 include an inner edge surface 11a surrounding the gap 30, an outer edge surface 11b having a curved surface substantially matching with an outer edge surface of the wafer 60, an upper surface 11A, and a lower surface 11B. The base member 10 comprises at least one of polyethylene terephthalate (PET), glass epoxy, carbon epoxy, glass fiber, or the like. Thickness of the base member 10 is in a range of about 300 μm to 800 μm.

The adhesive layer 20 is provided on a lower surface 10B of the base member 10, more specifically, on the lower surface 11B of the first annular portion 11. The adhesive layer 20 is thus an annular shaped layer. An inner facing surface 20a of the adhesive layer 20 is located slightly beyond the gap 30 in the outward radial direction and an outer facing surface 20b of the adhesive layer 20 is continuous with an outer facing surface 10b of the base member 10, specifically, with the outer edge surface 11b of the first annular portion 11. The adhesive layer 20 comprises at least one of silicone-based resin or PET. Thickness of the adhesive layer 20 is, for example, 20 μm to 30 μm. The adhesive layer 20 is formed of low adhesive resin, and is bonded to the wafer 60 in a manner in which the adhesive layer 20 may be peeled off and re-bonded. Elastic modulus of the adhesive layer 20 is lower than elastic modulus of the base member 10.

A region facing the gap 30 on the lower surface 11B of the first annular portion 11, for example, a lower surface of an inner periphery of the first annular portion 11 is a non-adhesive region 40 where the adhesive layer 20 is not provided. The non-adhesive region 40 is an annular region that is provided inside the adhesive layer 20 on the lower surface 10B of the base member 10, specifically, the lower surface 11B of the first annular portion 11 and surrounds the gap 30 on the lower surface 10B. Width of the non-adhesive region 40 in the radial direction is, for example, 1 mm to 3 mm.

The structure 201 is formed by bonding the support substrate 101 and an upper surface 60A of the wafer 60 with the adhesive layer 20. A lower side of the gap 30 is closed by the upper surface 60A of the wafer 60 and an upper side of the gap 30 is opened upward. The gap 30 communicates with an annular space 80 surrounded by the non-adhesive region 40, the upper surface 60A of the wafer 60, and the inner facing surface 20a of the adhesive layer 20.

The upper surface 60A of the wafer 60 is bonded to the lower surface 10B of the base member 10 via the adhesive layer 20. Accordingly, the wafer 60 is supported by the support substrate 101 and is prevented from being cracked or warped.

When the support substrate 101 is bonded in the structure 201, predetermined processing is performed on a lower surface 60B of the wafer 60. The wafer 60 is transported in a state in which the wafer 60 is supported by the support substrate 101 before and after the processing. After the predetermined processing and the transportation, dicing tape is bonded to the lower surface 60B and the support substrate 101 is separated from the wafer 60.

Figure 3A:
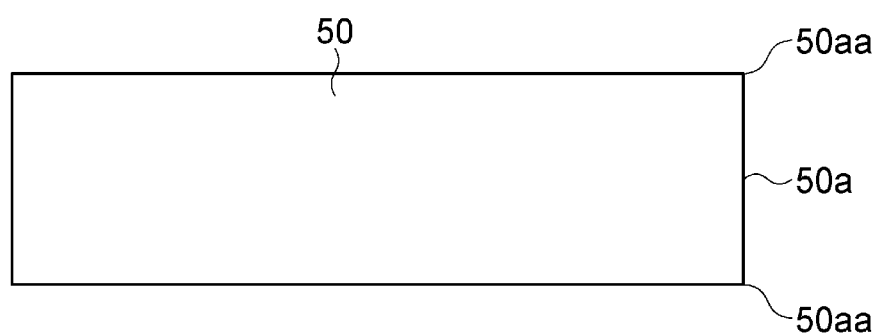
FIGS. 3A and 3B are plan views depicting a trigger member used in the first embodiment.
Figure 3B:
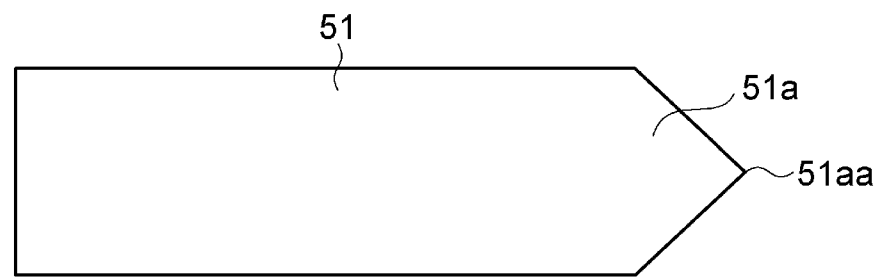
Figure 4A:
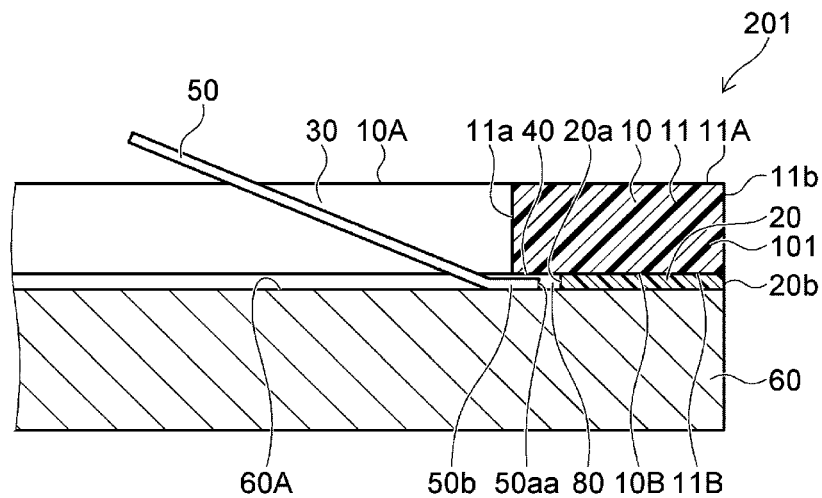
FIGS. 4A, 4B, and 4C are cross-sectional views depicting aspects of a method of peeling off a support substrate according to the first embodiment.
Figure 4B:
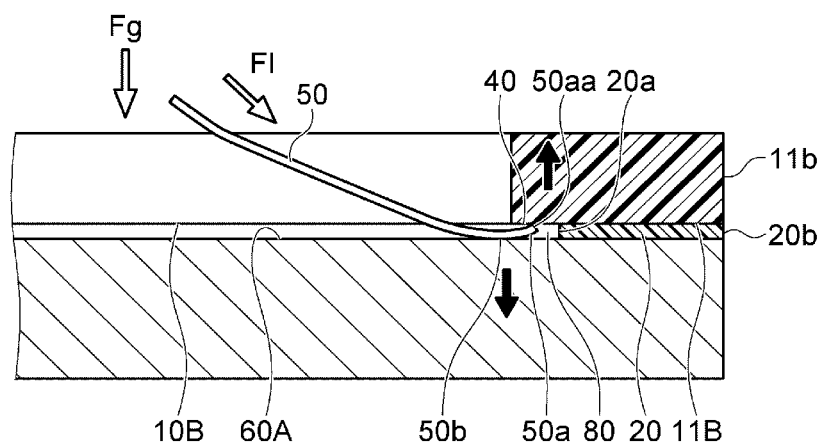
Figure 4C:
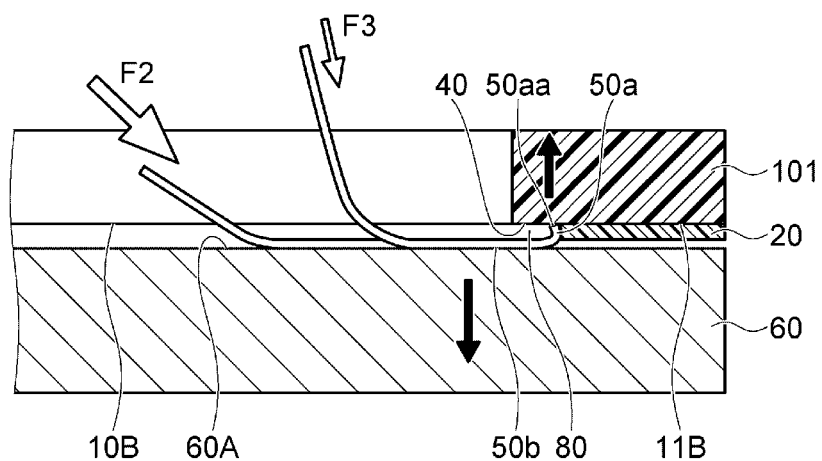

Next, a method for peeling off the support substrate 101 from the wafer 60 will be described. FIGS. 3A and 3B are plan views showing a trigger member used in the method for peeling off the support substrate according to the present embodiment. FIGS. 4A to 4C are cross-sectional views showing a method for peeling off the support substrate according to the present embodiment. FIGS. 5A to 8B are plan views showing a method for peeling off the support substrate according to the present embodiment.

A trigger member 50 and a biasing member 70 are used for peeling off the support substrate. As shown in FIG. 3A, the trigger member 50 has a sheet-like rectangular shape. For example, length of a short side is 2 cm to 5 cm, and length of a long side is 5 cm to 10 cm. An end portion of the trigger member 50 in a longitudinal direction is a tip portion 50a which includes two corners 50aa. Thickness of the trigger member 50 may be less than the thickness of the adhesive layer 20. The thickness of the trigger member 50 is, for example, about 100 μm. The trigger member 50 may comprise or include, for example, a flexible material. Alternatively, the trigger member 50 may use an elastic-plastic material (partially deformable plastic) whose deformation remains to some extent or a non-elastic material that does not return to its original shape after deformation. The trigger member 50 is preferably a clean material sheet that may be brought into a cleanroom or the like used in semiconductor device processing.

Another possible shape of the trigger member 50 may be a shape in which a tip portion 51a includes just one corner 51aa as shown in FIG. 3B.

The biasing member 70 biases (presses) the support substrate 101 towards the wafer 60. The biasing member 70 is, for example, a weight (e.g., a weighted disk) placed on an upper surface 10A of the base member 10. A plurality of biasing members 70 may be used. A biasing member 70 provides a load of several tens of grams or the like in a downward direction from the upper surface 10A to the wafer 60. One or more biasing members 70 may be placed at predetermined positions on the upper surface 10A, and the positions may thus be biased by the biasing members 70.

A method for peeling off the support substrate 101 by using a trigger member 50 without using any biasing member 70 will be described. As shown in FIG. 4A, the tip portion 50a of the trigger member 50 is inserted into the gap 30 opening towards the upper side of the structure 201 and the tip portion 50a is abutted against the upper surface 60A of the wafer 60. The tip portion 50a is directed towards the inner edge surface 11a of the first annular portion 11 and the inner facing surface 20a of the adhesive layer 20 located below the inner edge surface 11a to advance insertion of the trigger member 50. The tip portion 50a is inserted into the space 80 that is sandwiched by the non-adhesive region 40 and the upper surface 60A of the wafer 60. Specifically, a corner 50aa on one side of the tip portion 50a is first inserted into the space 80. An abutting portion 50b near the tip portion 50a now abuts against the upper surface 60A of the wafer 60 and a part of the trigger member 50 near the abutting portion 50b is bent.

As shown in FIG. 4B, when a load in an F1 direction (hereinafter, referred to as an F1 load) is applied to the trigger member 50 to further insert the trigger member 50, one or two corners 50aa will abut against the inner facing surface 20a of the adhesive layer 20 where a curved surface is formed. At this time, each abutting corner 50aa receives a return force from the inner facing surface 20a and the abutting portion 50b receives a return force from the upper surface 60A of the wafer 60. Any corner 50aa that abuts or pushes against the inner facing surface 20a warps upward and thus abuts against the non-adhesive region 40. Specifically, since the non-adhesive region 40 is flat, a corner 50aa or the tip portion 50a biases (presses against) the non-adhesive region 40.

Accordingly, the upper surface 60A of the wafer 60 is pressed downwards by the abutting portion 50b and the non-adhesive region 40 is pressed upwards by insertion of the tip portion 50a. The trigger member 50 biases the lower surface 10B of the base member 10 upwards and biases the upper surface 60A of the wafer 60 downwards. The base member 10 and the wafer 60 are thus biased in directions to be separated from each other. Accordingly, the upper surface 60A of the wafer 60 can be gradually peeled off from the surface of the adhesive layer 20.

As shown in FIG. 4C, an F2 load or an F3 load that is larger than the F1 load can be applied to the trigger member 50 to which an insertion force F1 has already been applied. At this time, the abutting portion 50b that abuts against the upper surface 60A of the wafer 60 has a larger contacting area and the upper surface 60A of the wafer 60 is biased downwards more strongly. The tip portion 50a is further bent against the inner facing surface 20a and the non-adhesive region 40 is biased upwards more strongly.

Accordingly, the tip portion 50a and the abutting portion 50b of the trigger member 50 apply a stronger force to separate the base member 10 and the wafer 60 from each other, so that the upper surface 60A of the wafer 60 is peeled off from the surface of the adhesive layer 20 that is fixed on the base member 10. In this state, the support substrate 101 can be lifted upwards and detached from the upper surface 60A of the wafer 60, and the peeling off the support substrate 101 is completed.

Even when a trigger member 51 including just one corner 51aa, as shown in FIG. 3B, is used instead of the trigger member 50 including two corners 50aa, as shown in FIG. 3A, the support substrate 101 may be peeled off from the wafer 60 in substantially same manner as described above, with the difference being the inserting the trigger member 50 from a side of the tip portion 50a as shown in FIG. 4B, since the trigger member 51 includes only corner 51aa positioned at the center of the tip portion 51a, the single corner 51aa may be inserted into the space 80 when the trigger member 51 moves straight ahead and is inserted in a longitudinal direction for the trigger member 51. Therefore, even when opening width of the gap 30 is small, the corner 51aa can be easily inserted into the space 80 if width of the trigger member 51 is less than the opening width of the gap 30.

Certain effects of the first embodiment will be described. Since the support substrate 101 is peeled off by the trigger member 50, the adhesive layer 20 typically does not remain on the wafer 60 and cleaning to remove the adhesive layer 20 from the wafer 60 is not needed in the present embodiment. In addition, since the wafer 60 is supported by the support substrate 101, which has high elasticity, via the adhesive layer 20 having a low elasticity in the structure 201, the wafer 60 is well supported and is less likely to be cracked. Since the non-adhesive region 40 and the adhesive layer 20 are provided on the lower surface 11B of the first annular portion 11, it is easy to peel off the support substrate 101 and a trigger member 50 can be inserted into a space corresponding to the non-adhesive region 40.

Since the outer facing surface 20b of the adhesive layer 20 may be substantially continuous with an outer edge surface 60b of the wafer 60, a liquid solvent or etchant used for processing the lower surface 60B of the wafer 60 may be prevented from penetrating, and cracking can be prevented from occurring at the outermost periphery of the wafer 60.

In the present embodiment, the non-adhesive region 40 is provided and the flexible trigger member 50 is inserted into a space surrounded by the non-adhesive region 40 and the upper surface 60A that faces the non-adhesive region 40. Accordingly, the trigger member 50 applies a force (hereinafter, referred to as a "separation force") in a direction which promotes separating the support substrate 101 and the wafer 60 from each other, and thus the support substrate 101 can be more easily peeled off from the wafer 60. The wafer 60 is less likely to be damaged by the soft, flexible trigger member 50 abutting against the wafer 60. Since the force applied by the soft trigger member 50 is relatively small, the force is less likely to peel off the adhesive layer 20 all at once and therefore stress on the wafer 60 due to the peeling off process can be reduced.

Since the adhesive layer 20 uses a low adhesive resin, the adhesive layer 20 can still be peeled off by a trigger member 50 that applies only a small force.

The shape of the trigger member 50 in all examples may not be flat. For example, if the trigger member 50 is an elastic-plastic deformable material and is bent such that the corner 50aa faces slightly upwards, the corner 50aa may be easily warped when the corner 50aa abuts against the inner facing surface 20a of the adhesive layer 20.

Hereinafter, a method for peeling off the support substrate 101 using the biasing member 70 and the trigger member 50 will be described with reference to FIGS. 5A to 8B. Although the following description describes an example in which eight biasing members 70 are used, the number of the biasing members 70 is not required to be eight.

Figure 5A:
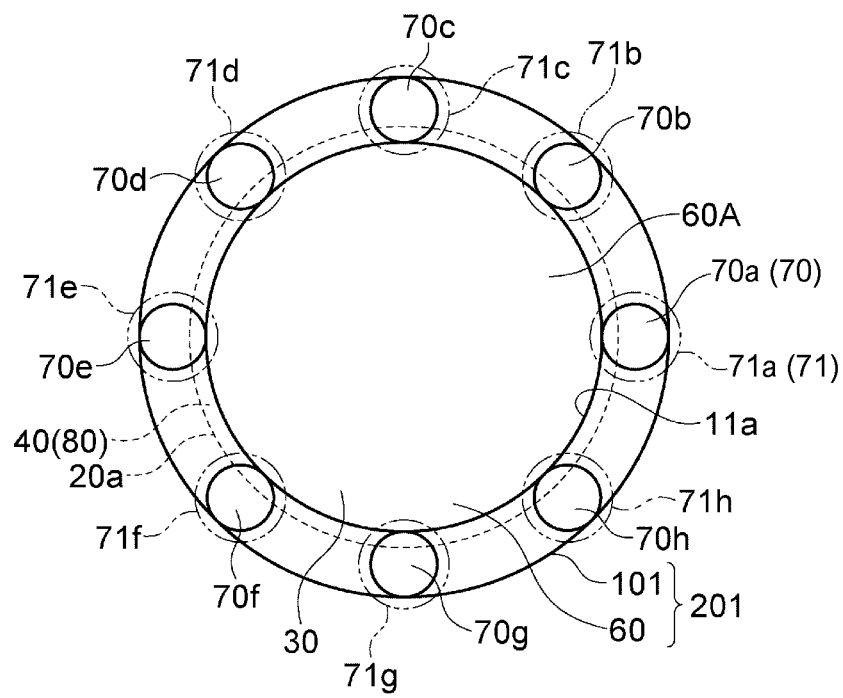
FIGS. 5A and 5B are plan views depicting aspects of a method for peeling off the support substrate according to the first embodiment.

As shown in FIG. 5A, the structure 201 is placed on a flat surface with the wafer 60 of the structure 201 directed downwards in a gravity direction and the support substrate 101 directed upwards in a direction opposite to the gravity direction. Arrangement units 71a, 71b, 71c, 71d, 71e, 71f, 71g, 71h (hereinafter, each may be more simply referred to as an "arrangement unit 71") that arrange biasing members 70a, 70b 70c, 70d, 70e, 70f, 70g, 70h (hereinafter, each may be more simply referred to as a "biasing member 70") are provided on the upper surface 11A of the first annular portion 11 including the adhesive layer 20 thereon. For example, when the structure 201 is viewed from above, the arrangement unit 71a is provided at a one position on the upper surface 11A, and the first annular portion 11 is conceptually divided into eight equal portions around the circumferential direction with reference to the arrangement unit 71a. Then, the arrangement units 71a, 71b, 71c, 71d, 71e, 71f, 71g, and 71h are provided on one of the eight equal divided portions in ascending order from the arrangement unit 71a in the counterclockwise direction.

The biasing members 70a, 70b . . . 70h are placed in the arrangement units 71a, 71b . . . 71h, respectively. The biasing members 70a, 70b . . . 70h respectively bias the arrangement units 71a, 71b . . . 71h downwards (gravity direction).

Figure 5B:
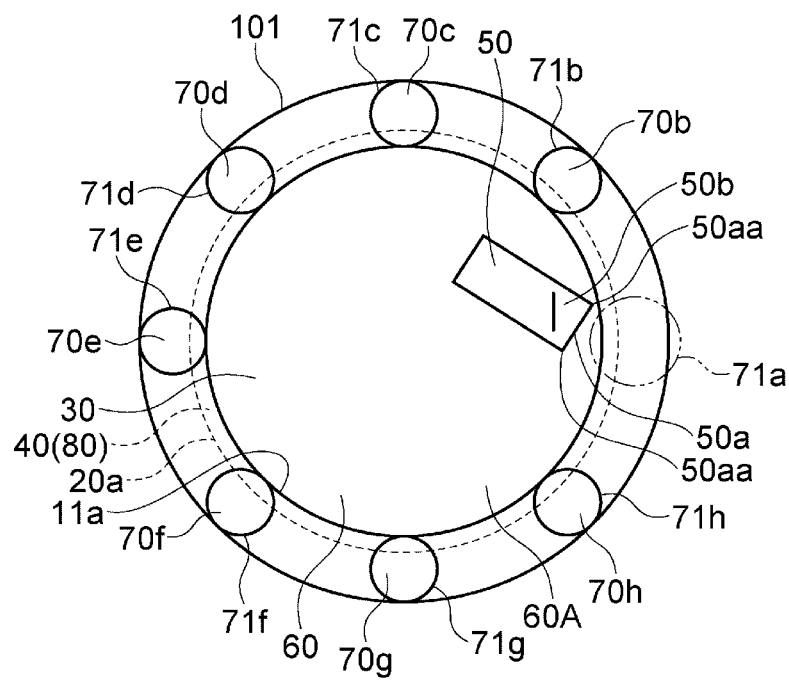

In FIG. 5B, the biasing member 70a has been removed so as to release the downward biasing on the arrangement unit 71a. The tip portion 50a of the trigger member 50 is inserted from an upper side of the gap 30 into a part of the space 80 corresponding to the arrangement unit 71a. Insertion of the trigger member 50 is proceeds in a manner similar to the procedure described in conjunction with FIGS. 3A and 3B. While the biasing members 70b and 70h on both sides of the trigger member 50 and the other biasing members 70c . . . 70g continue the downward biasing, the trigger member 50 is inserted under the arrangement unit 71a that is not being biased downwards and the trigger member 50 applies a separation force to both the base member 10 and the wafer 60.

Figure 6A:
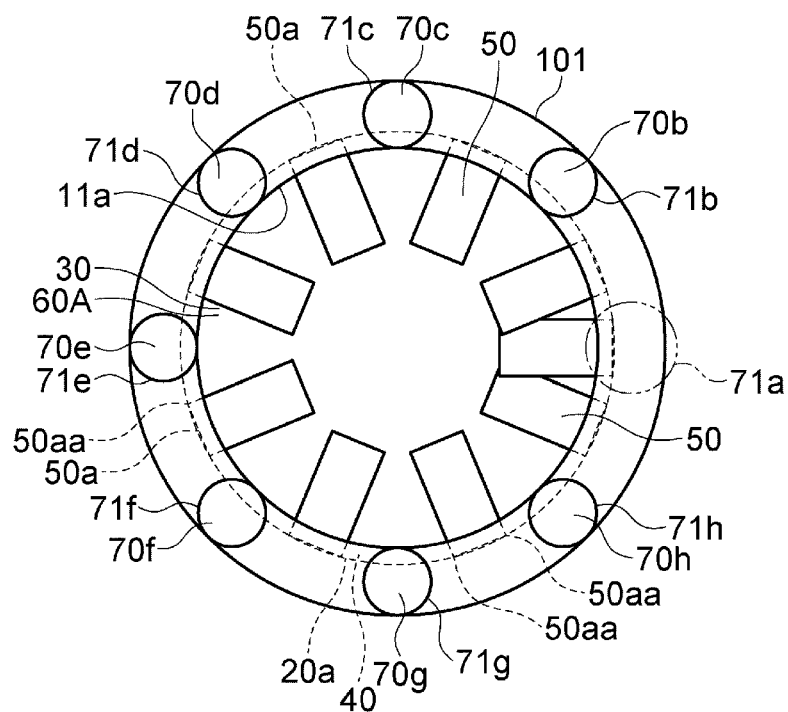
FIGS. 6A and 6B are plan views depicting aspects of a method for peeling off the support substrate according to the first embodiment.

As shown in FIG. 6A, eight trigger members 50 are inserted into a part of the space 80 at which the arrangement units 71a . . . 71h are not provided, as viewed from above. That is, the each of these eight trigger members 50 are inserted at a position between adjacent arrangement units 71. Specifically, a trigger member 50 is inserted one by one in a similar manner into eight portions on the upper surface 11A, which are a portion between the arrangement unit 71a and the arrangement unit 71b, a portion between the arrangement unit 71b and the arrangement unit 71c, a portion between the arrangement unit 71c and the arrangement unit 71d, a portion between the arrangement unit 71d and the arrangement unit 71e, a portion between the arrangement unit 71e and the arrangement unit 71f, a portion between the arrangement unit 71f and the arrangement unit 71g, a portion between the arrangement unit 71g and the arrangement unit 71h, and a portion between the arrangement unit 71h and the arrangement unit 71a. Thus, in a situation in which the biasing members 70b . . . 70h separately bias downwards both sides of nine inserted trigger members 50, the trigger members 50 apply a separation force to portions that are not biased downwards and where the biasing members 70b . . . 70h are not provided. Since three trigger members 50 are inserted into the region that is between the arrangement unit 71b and the arrangement unit 71h and that is not biased downwards, the upper surface 60A of the wafer 60 is easily peeled off from the surface of the adhesive layer 20 between the arrangement unit 71b and the arrangement unit 71h.

Figure 6B:
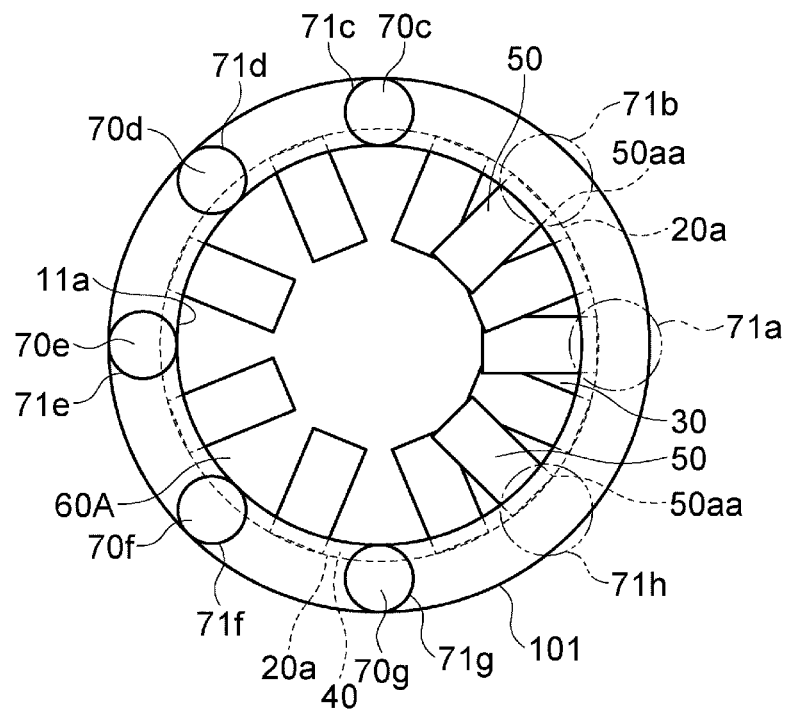

As shown in FIG. 6B, the biasing members 70b and 70h are removed to release the biasing on the arrangement units 71b and 71h. Two trigger members 50 are then separately inserted under the arrangement units 71b and 71h where the downward biasing has been released. In a situation in which almost a half of the first annular portion 11 including the arrangement units 71c, 71d, 71e, 71f, and 71g is still biased, peeling off of the adhesive layer 20 from portions between the arrangement unit 71c and the arrangement unit 71a and between the arrangement unit 71g and the arrangement unit 71a that are not biased downwards has been advanced since two additional trigger members 50 have now been inserted into the portions that are not being biased downwards.

Figure 7A:
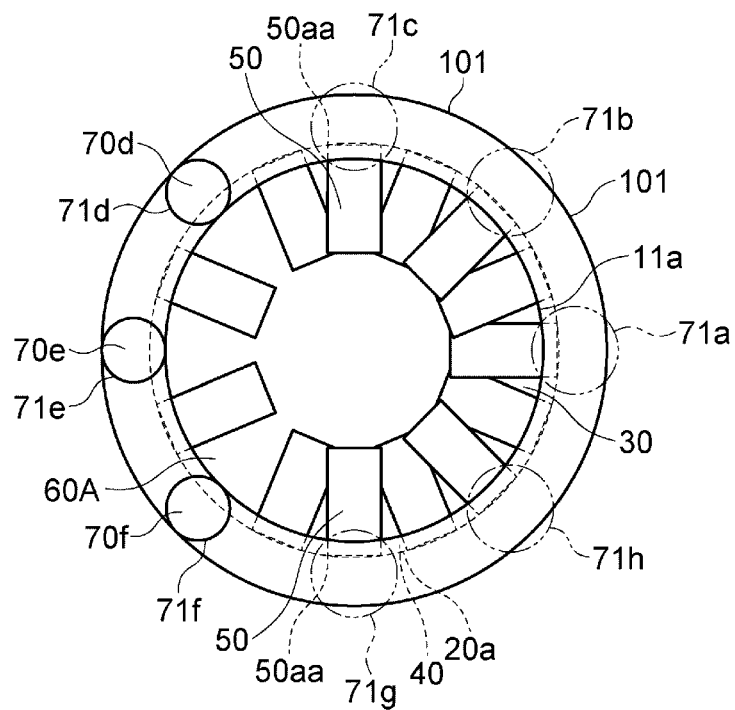
FIGS. 7A and 7B are plan views depicting aspects of a method for peeling off the support substrate according to the first embodiment.

As shown in FIG. 7A, the biasing members 70c and 70g are next removed to release the biasing on the arrangement units 71c and 71g. Two trigger members 50 are then separately inserted under the arrangement units 71c and 71g where the downward biasing has been released. In a situation in which the first annular portion 11 at the arrangement units 71d, 71e, and 71f is still being biased, peeling off of the adhesive layer 20 on portions between the arrangement unit 71d and the arrangement unit 71a and between the arrangement unit 71f and the arrangement unit 71a that are not being biased downwards has been advanced since two additional trigger members 50 have been inserted under the arrangement units 71c and 71g that are now not being biased downwards.

Figure 7B:
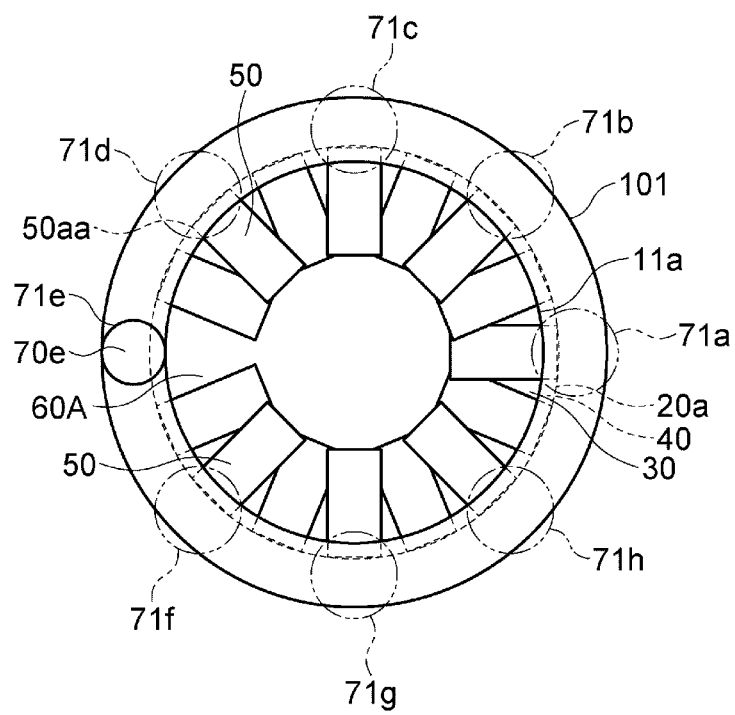

As shown in FIG. 7B, the biasing members 70d and 70f are next removed to release the biasing on the arrangement units 71d and 71f. Two trigger members 50 are then separately inserted under the arrangement units 71d and 71f where the downward biasing has been released. In a situation in which the first annular portion 11 at the arrangement unit 71e is still being biased, peeling off of the adhesive layer 20 on portions between the arrangement unit 71e and the arrangement unit 71a that are not being biased downwards has been advanced since two additional trigger members 50 are now inserted under the arrangement units 71d and 71f that are now not being biased downwards.

Figure 8A:
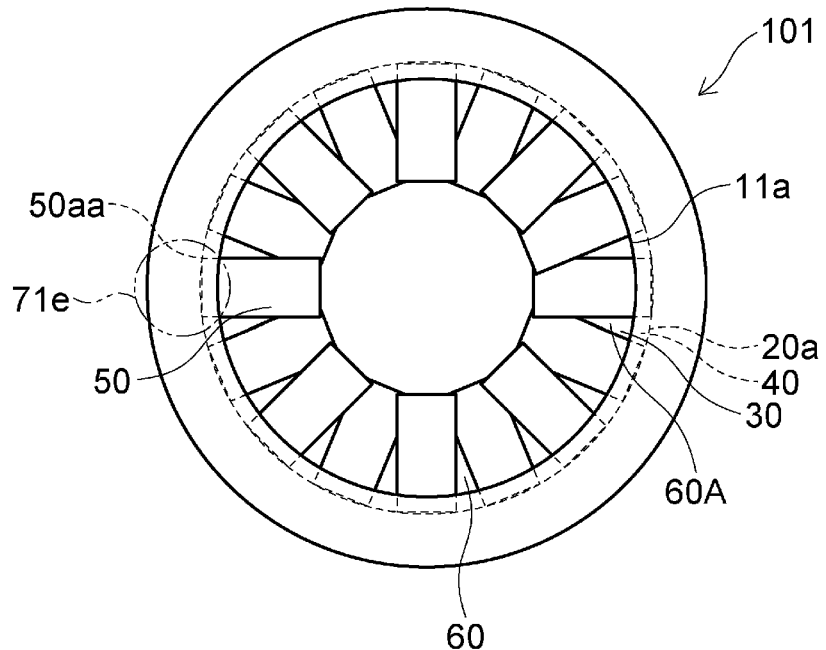
FIGS. 8A and 8B are plan views depicting aspects of a method for peeling off the support substrate according to the first embodiment.

As shown in FIG. 8A, the biasing member 70e is next removed to release the biasing on the arrangement unit 71e. One trigger member 50 is inserted under the arrangement unit 71e where the downward biasing has been released. Now the entire first annular portion 11 has been released from biasing, peeling off of the entire adhesive layer 20 has been advanced since one additional trigger member 50 has been inserted under the arrangement unit 71e that is not now being biased downwards. If there is any portion where the adhesive layer 20 is not yet peeled off, the adhesive layer 20 can be peeled off by applying an appropriate insertion force to the trigger member 50 corresponding to the portion.

Figure 8B:
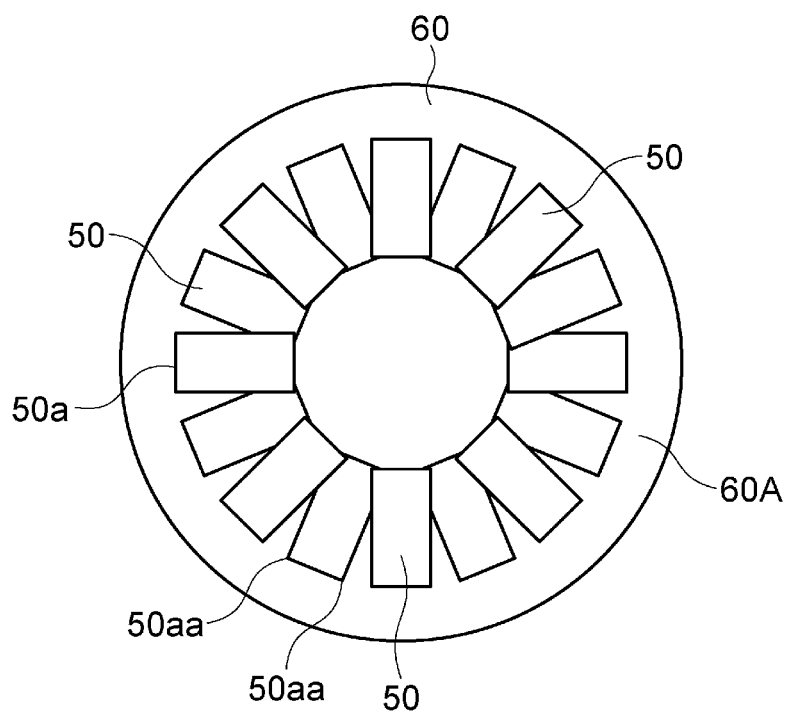

As shown in FIG. 8B, the support substrate 101 is lifted upwards and peeling off of the support substrate 101 is now complete. All the trigger members 50 are then collected from the upper surface 60A of the wafer 60.

Hereinafter, various effects of the method for peeling off the support substrate 101 using the biasing member 70 and the trigger member 50 will be described. The trigger member 50 is inserted to apply a separation force while the upper surface 10A of the base member 10 is still being biased downwards by a biasing member 70, the upper surface 60A of the wafer 60 is prevented from being peeled off from the surface of the adhesive layer 20 all at once. Accordingly, stress on the wafer 60 caused by the peeling off process can be reduced, and the wafer 60 can be prevented from being cracked.

In a case where the trigger member 50 is formed of an elastic-plastic material, a fold generally remains near the abutting portion 50b or on the tip portion 50a due to the insertion process. Accordingly, even when the insertion force of the trigger member 50 is released, a force due to the weight of the trigger member 50 is applied in the Fg direction shown in FIG. 4B and the insertion force is converted into a separation force. The separation force can be continuously applied to the support substrate 101 and the wafer 60.

Although the biasing member 70 works by an applied weight of the member in the present embodiment, the present disclosure is not limited thereto. For example, biasing may be performed by a machine. In this case, the biasing may be applied from the lower surface 60B of the wafer 60 in a direction opposite to the gravity direction instead of the gravity direction.

Figure 9:
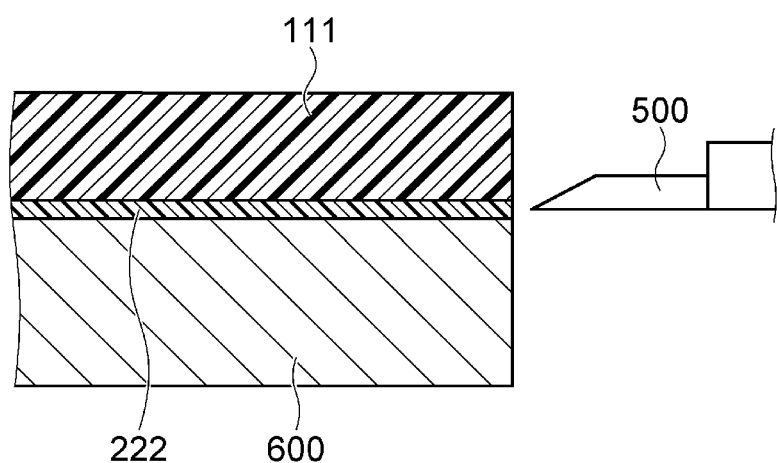
FIG. 9 is a cross-sectional view depicting aspects of a method for peeling off a support substrate according to a comparative example.

Hereinafter, a comparative example in which a trigger member 50 is not used will be described with reference to FIG. 9. FIG. 9 is a cross-sectional view showing a method for peeling off a support substrate according to the comparative example. As shown in FIG. 9, no gap 30 or otherwise is formed in support substrate 111 in the comparative example. The trigger members 50 are not used in the comparative example.

As shown in FIG. 9, an adhesive layer 222 is used to bond the support substrate 111 and a wafer 600 in the comparative example. A trigger member 500 is formed of steel and having a sharp tip. In order to prevent the wafer 600 from being damaged, the tip of the trigger member 500 is inserted from an outer periphery side of the support substrate 111 into the adhesive layer 222. Since an insertion position of the trigger member 500 needs to be extremely accurate positionally, operation is difficult. Since accuracy is required, in general, a plurality of trigger members 500 have to be prepared according to the possible differences in materials and thicknesses of the adhesive layer 222 that might be utilized. Since the trigger member 500 is a hard material, the wafer 600 may be damaged in the separation process if trigger member 500 contacts the wafer 600. Additionally, since the adhesive layer 222 typically remains bonded to the wafer 600 after the support substrate 111 is peeled off, the wafer 600 has to be cleaned after the separation process.

Second Embodiment

Figure 10:
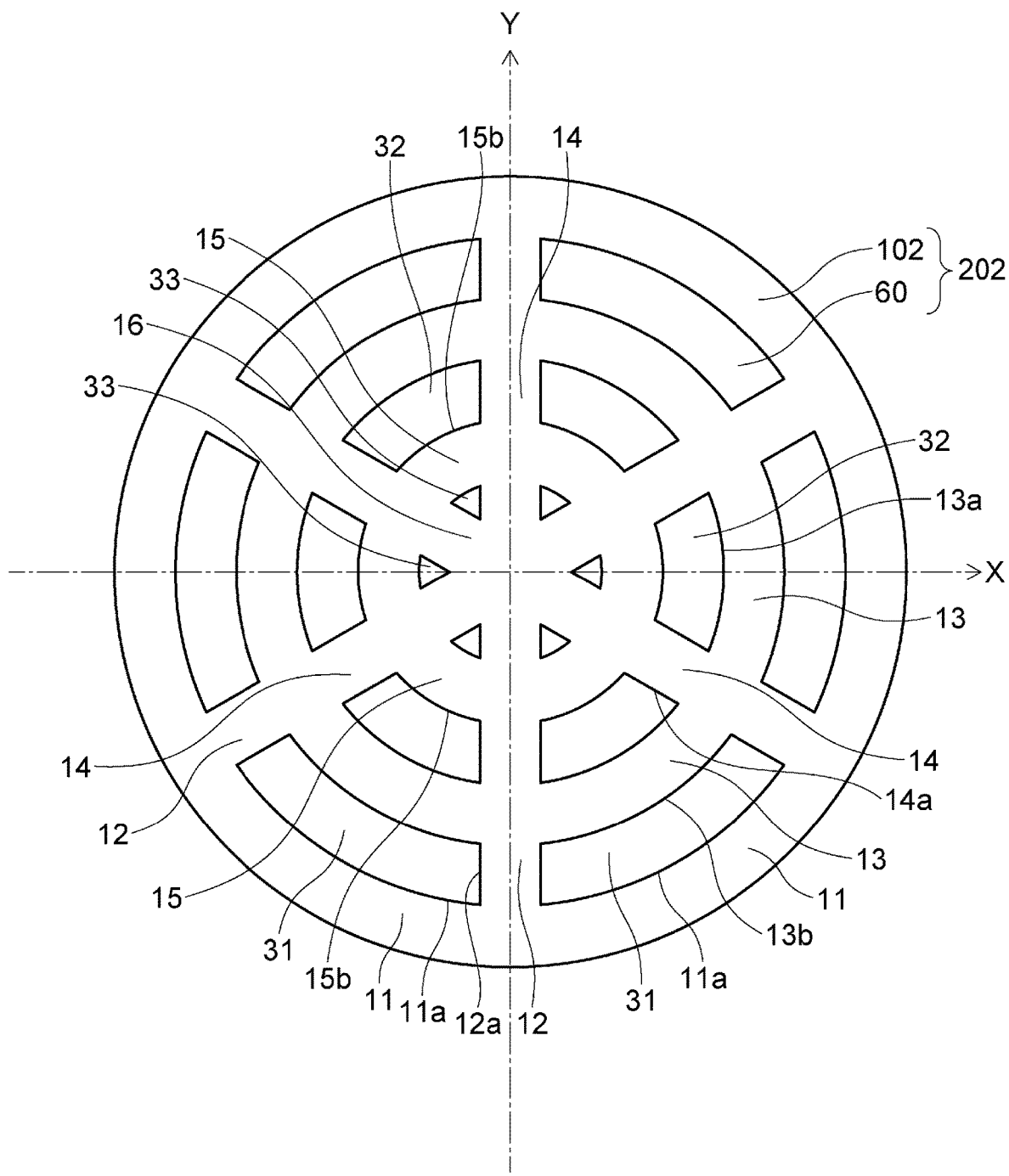
FIG. 10 is a plan view of a structure according to a second embodiment.
Figure 11:
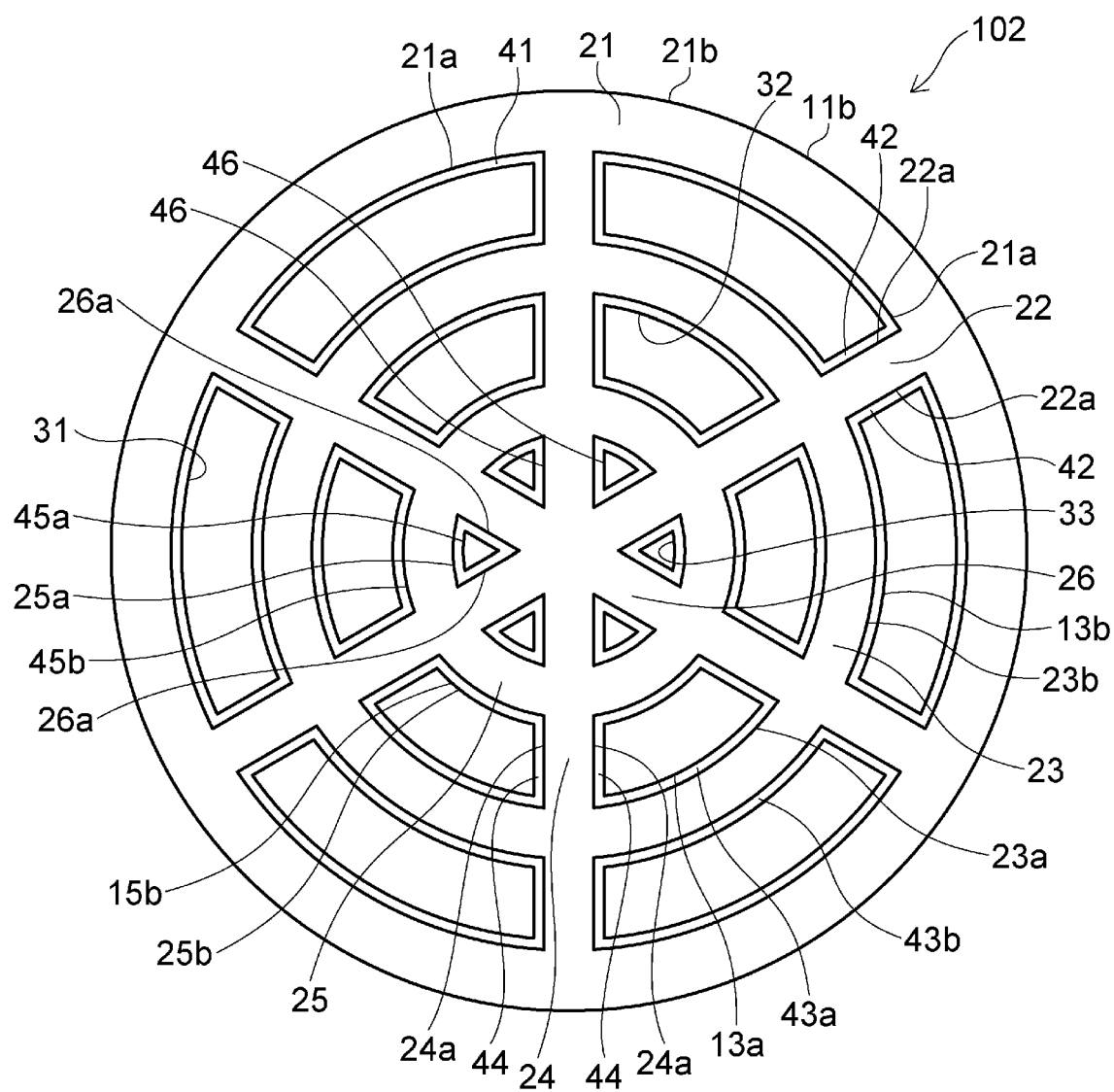
FIG. 11 is a bottom view of a support substrate according to the second embodiment.

FIG. 10 is a plan view showing a wafer-support substrate structure according to a second embodiment. FIG. 11 is a bottom view showing a support substrate according to the second embodiment.

As shown in FIGS. 10 and 11, the base member 10 of a support substrate 102 includes the first annular portion 11 located at an outermost edge, a second annular portion 13 located inside the first annular portion 11, and a third annular portion 15 located inside the second annular portion 13. The first annular portion 11, the second annular portion 13, and the third annular portion 15 are provided concentrically in the same plane.

The base member 10 further includes a plurality of first diameter portions 12 extending radially between the inner edge surface 11a of the first annular portion 11 and an outer facing surface 13b of the second annular portion 13, a plurality of second diameter portions 14 extending radially between an inner facing surface 13a of the second annular portion 13 and an outer facing surface 15b of the third annular portion 15, and a plurality of third diameter portions 16 extending radially from an inner facing surface 15a of the third annular portion 15 and intersecting with each other at the center of the first annular portion 11. The first diameter portions 12, the second diameter portions 14, and the third diameter portions 16 are all provided in the same direction as viewed from the center of the first annular portion 11. For example, when an upper end of a line Y of center lines X and Y of a structure 202 is 0 degree, the first diameter portions 12, the second diameter portions 14, and the third diameter portions 16 are provided at positions of 0 degree, 60 degrees, 120 degrees, 180 degrees, 240 degrees and 300 degrees in the example shown in FIGS. 10 and 11.

A plurality of gaps 31, 32, and 33 penetrating through the base member 10 in a thickness direction are formed in the base member 10.

The plurality of gaps 31 are provided between the first annular portion 11 and the second annular portion 13. The gaps 31 are spaces sandwiched by two first diameter portions 12 on each side. A plurality of gaps 32 are provided between the second annular portion 13 and the third annular portion 15. The gaps 32 are spaces sandwiched by two second diameter portions 14 on each side. A plurality of gaps 33 are provided inside the third annular portion 15 and are substantially triangular spaces surrounded by two third diameter portions 16.

Adhesive layers 21, 22, 23, 24, 25, and 26 are respectively provided on the lower surface 11B of the first annular portion 11, a lower surface 12B of the first diameter portion 12, a lower surface 13B of the second annular portion 13, a lower surface 14B of the second diameter portion 14, a lower surface 15B of the third annular portion 15, and a lower surface 16B of the third diameter portion 16.

The adhesive layer 21 provided on the first annular portion 11 has an annular shape. An inner facing surface 21a of the adhesive layer 21 faces the gap 31 and is located slightly beyond the inner edge surface 11a of the first annular portion 11 in the radial direction. A non-adhesive region 41 is between the inner facing surface 21a and the inner edge surface 11a. That is, the non-adhesive region 41 is on a lower surface of an inner periphery of the first annular portion 11. A portion of an inner side of the adhesive layer 21 that faces the lower surface 12B of the first diameter portion 12 is not provided with the non-adhesive region 41 and is continuous with the adhesive layer 22 on the first diameter portion 12. An outer facing surface 21b of the adhesive layer 21 is continuous with the outer edge surface 11b of the first annular portion 11 without separation therefrom, and is not provided with a non-adhesive region.

The adhesive layer 22 provided on the first diameter portion 12 has a strip-shape. An outer side end of the adhesive layer 22 is continuous with the adhesive layer 21 on the first annular portion 11, and the other inner side end is continuous with the adhesive layer 23 on the second annular portion 13. Side surfaces 22a on both sides of the adhesive layer 22 face the gap 31. The side surfaces 22a are located at a position slightly inside a side surface 12a of the first diameter portion 12 and a non-adhesive region 42 is interposed between the side surface 22a and the side surface 12a of the first diameter portion 12. That is, the non-adhesive region 42 is provided on lower surfaces of both side portions of the first diameter portion 12.

The adhesive layer 23 provided on the second annular portion 13 has an annular shape. An inner facing surface 23a of the adhesive layer 23 faces the gap 32 and is located slightly beyond the inner facing surface 13a of the second annular portion 13 in the radial direction. A non-adhesive region 43a is between the inner facing surface 23a and the inner facing surface 13a. A portion of an inner side of the adhesive layer 23 that faces a lower surface 14B of the second diameter portion 14 lacks a non-adhesive region 43a and is continuous with the adhesive layer 24 on the second diameter portion 14. An outer facing surface 23b of the adhesive layer 23 faces the gap 31 and is located slightly inside the outer facing surface 13b of the second annular portion 13. A non-adhesive region 43b is between the outer facing surface 23b and the outer facing surface 13b. A portion of an outer side of the adhesive layer 23 that faces the lower surface 12B of the first diameter portion 12 is lacks the non-adhesive region 43b and is continuous with the adhesive layer 22 on the first diameter portion 12. That is, the non-adhesive region 43a is provided on a lower surface of a part of an inner periphery of the second annular portion 13 and the non-adhesive region 43b is provided on a lower surface of a part of an outer periphery of the second annular portion 13.

The adhesive layer 24 provided on the second diameter portion 14 is strip-shaped. An outer side end of the adhesive layer 24 is continuous with the adhesive layer 23 on the second annular portion 13 and the other inner side end is continuous with the adhesive layer 25 on the third annular portion 15. Side surfaces 24a on both sides of the adhesive layer 24 face the gap 32. The side surfaces 24a are located at a position slightly inside a side surface 14a of the second diameter portion 14 and a non-adhesive region 44 is between the side surface 24a and the side surface 14a.

The adhesive layer 25 provided on the third annular portion 15 has an annular shape. An inner facing surface 25a of the adhesive layer 25 faces the gap 33 and is located slightly beyond the inner facing surface 15a of the third annular portion 15 in the radial direction. A non-adhesive region 45a is between the inner facing surface 25a of the adhesive layer 25 and the inner facing surface 15a of the third annular portion 15. A portion of an inner side of the adhesive layer 25 that faces the lower surface 16B of the third diameter portion 16 lacks the non-adhesive region 45a and is continuous with the adhesive layer 26 on the third diameter portion 16. An outer facing surface 25b of the adhesive layer 25 faces the gap 32 and is located slightly inside the outer facing surface 15b of the third annular portion 15 in the radial direction. A non-adhesive region 45b is between the outer facing surface 25b and the outer facing surface 15b. A portion of an outer side of the adhesive layer 25 that faces the lower surface 14B of the second diameter portion 14 lacks the non-adhesive region 45b and is continuous with the adhesive layer 24 on the second diameter portion 14. That is, the non-adhesive region 45a is provided on a lower surface of a part of an inner periphery of the third annular portion 15 and the non-adhesive region 45b is provided on a lower surface of a part of an outer periphery of the third annular portion 15.

The adhesive layer 26 provided on the third diameter portion 16 is strip-shaped. An outer side end of the adhesive layer 26 is continuous with the adhesive layer 25 on the third annular portion 15 and the other inner side end intersects with the center of the first annular portion 11. Side surfaces 26a on both sides of the adhesive layer 26 face the gap 34. The side surfaces 26a are located at a position slightly inside a side surface 16a of the third diameter portion 16 and a non-adhesive region 46 is between the side surface 26a and the side surface 16a of the third diameter portion 16.

In this manner, the gap 31 is surrounded by the non-adhesive regions 41, 43b, and 42. The gap 32 is surrounded by the non-adhesive regions 43a, 44, and 45b. The gap 33 is surrounded by the non-adhesive regions 45a and 46.

Certain effects of the second embodiment will be described. The support substrate 102 according to the second embodiment has good supporting properties since a portion of the wafer 60 inside the first annular portion 11 may be supported by the second annular portion 13, the third annular portion 15, the first diameter portion 12, the second diameter portion 14, and the third diameter portion 16. Removing of the support substrate 102 can be easy since the gaps 31, 32, and 33 are substantially uniformly provided throughout the base member 10. Since a plurality of gaps 31, 32, and 33 provided substantially uniformly throughout the base member 10 and non-adhesive regions surrounding the gaps 31, 32, and 33 are also provided, a trigger member 50 can also be substantially uniformly inserted into the lower surface 10B of the base member 10, and it is less likely to generate an unpeeled portion.

In the second embodiment, for example, the second annular portion 13 is provided with the non-adhesive regions 43a and 43b in regions facing the gap 31 and the gap 32, respectively. However, the present disclosure is not limited thereto and in other embodiments only one non-adhesive region may be provided. If peeling off can be sufficiently performed, then the non-adhesive region 40 may not be provided as appropriate in some examples.

The method for peeling off the support substrate 102 is similar to the method according to the first embodiment. The support substrate 102 may be peeled off using only trigger members 50, and the support substrate 102 may be peeled off by pressing with the biasing member 70 and using the trigger members 50. Since the support substrate 102 is provided with a plurality of gaps 31, 32, 33 and a plurality of non-adhesive regions 41, 42, 43a, 43b, 44, 45a, 45b, and 46, a trigger member 50 may be inserted into various positions of the non-adhesive regions from various angles.

For example, a trigger member 50 may be appropriately inserted from the inner facing surface 13a of the second annular portion 13 and the inner facing surface 15a of the third annular portion 15 or the outer facing surface 13b of the second annular portion 13 and the outer facing surface 15b of the third annular portion 15. Although a trigger member 50 may be inserted from the inner facing surface 13a of the second annular portion 13 and the inner facing surface 15a of the third annular portion 15, the outer facing surface 13b and the outer facing surface 15b generally provide wider (circumferential width) or more accessible insertion positions than the inner facing surface 13a and the inner facing surface 15a, respectively, and thus allow the trigger members 50 to be inserted more easily. In case of the first diameter portion 12, the second diameter portion 14, and the third diameter portion 16, a trigger member 50 may be appropriately inserted from both or either side surfaces 12a, 14a, and 16a.

In a case where the biasing member 70 is used, rapid peeling off can be prevented and the wafer 60 can be peeled off without being damaged when an arrangement unit 71 is substantially uniformly provided on the first annular portion 11, the second annular portion 13, the third annular portion 15, the first diameter portion 12, the second diameter portion 14, and the third diameter portion 16 and is biased with a biasing member 70. Although the second embodiment describes an example including three annular portions, the present disclosure is not limited thereto. Alternatively, three or more annular portions may be provided and more diameter portions may be provided accordingly.

Other configurations, operations, and effects according to the second embodiment are similar to those according to the first embodiment.

Third Embodiment

Figure 12:
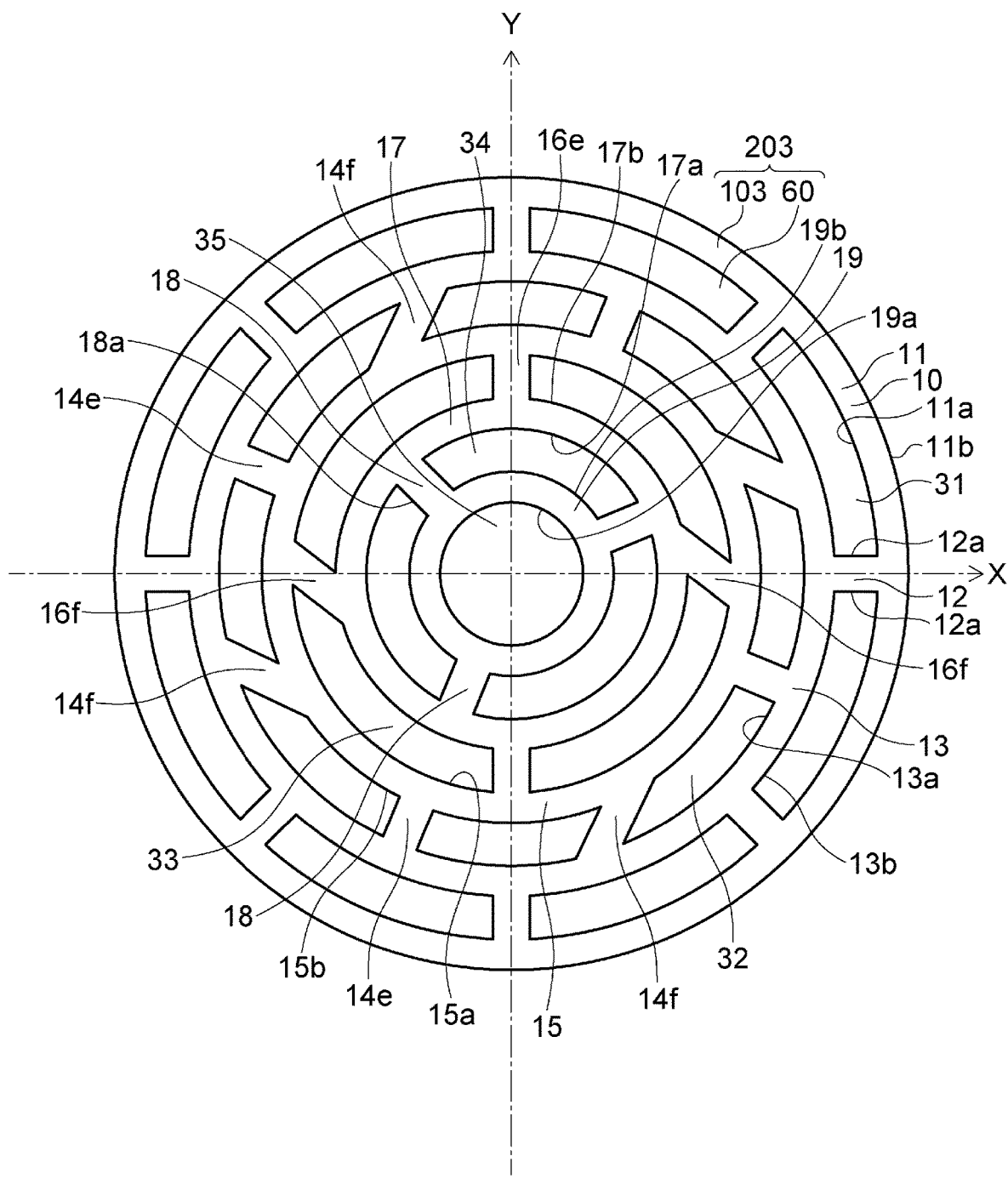
FIG. 12 is a plan view of a structure according to a third embodiment.

FIG. 12 is a plan view showing a wafer-support substrate structure according to a third embodiment. Similar to the second embodiment, the base member 10 of a support substrate 103 in the third embodiment, as shown in FIG. 12, includes a first annular portion 11 up to a fifth annular portion 19, each of which are concentrically provided from an outermost periphery. A first diameter portion 12, second diameter portions 14e and 14f, third diameter portions 16e and 16f, and a fourth diameter portion 18 are provided spanning between the annular portions.

When an upper end of a line Y of center lines X and Y of a structure 203 is 0 degree, for example, the first diameter portion 12 is provided at eight positions of 0 degree, 45 degrees, 90 degrees, 135 degrees, 180 degrees, 225 degrees, 270 degrees, and 315 degrees, separately. The first diameter portion 12 extends towards the center of the first annular portion 11.

The second diameter portions 14e and 14f are misaligned with (offset from) the first diameter portion 12 and the third diameter portions 16e and 16f, and are provided extending in different directions as viewed from the center of the support substrate 103. When the upper end of the line Y of the center lines X and Y is 0 degree, for example, the second diameter portions 14e and 14f are provided at eight positions of 15 degrees, 60 degrees, 105 degrees, 150 degrees, 195 degrees, 240 degrees, 285 degrees, and 330 degrees. The second diameter portion 14e has a shape extending towards the center of the second annular portion 13. The second diameter portion 14f extends in a direction inclined slightly counterclockwise with respect to a direction towards the center of the second annular portion 13. The second diameter portion 14e and the second diameter portion 14f are alternately provided in a circumferential direction.

The third diameter portions 16e and 16f are misaligned with (offset from) the second diameter portions 14e and 14f and the fourth diameter portion 18, and are provided extending in different directions as viewed from the center of the support substrate 103. When the upper end of the Y line of the center lines X and Y is 0 degree, for example, the third diameter portions 16e and 16f are provided at four positions of 0 degree, 90 degrees, 180 degrees, and 270 degrees. The third diameter portion 16e has a shape extending towards the center of the second annular portion 13. The third diameter portion 16f extends in a direction inclined slightly counter-clockwise with respect to a direction towards the center of the third annular portion 15. The third diameter portion 16e and the third diameter portion 16f are alternately provided in the circumferential direction.

The fourth diameter portion 18 is misaligned with (offset from) the third diameter portions 16e and 16f, and is provided extending in different directions as viewed from the center. When the upper end of the Y line of the center lines X and Y is 0 degree, for example, the fourth diameter portion 18 is provided at three portions of 75 degrees, 195 degrees, and 315 degrees. The fourth diameter portion 18 has a shape extending towards the center of the fourth annular portion 17.

A plurality of gaps 31 are between the first annular portion 11 and the second annular portion 13. Each gap 31 is sandwiched by two first diameter portions 12. A plurality of gaps 32 are between the second annular portion 13 and the third annular portion 15. Each gap 32 is sandwiched by second diameter portions 14e and 14f. A plurality of gaps 33 are between the third annular portion 15 and the fourth annular portion 17. Each gap 33 is surrounded by third diameter portions 16e and 16f. A plurality of gaps 34 are between the fourth annular portion 17 and the fifth annular portion 19. Each gap 34 is surrounded by two fourth diameter portions 18. A gap 35 is at the center of the first annular portion 11 and surrounded by the fifth annular portion 19.

Similar to the second embodiment, the adhesive layer 20 is separately provided on the various lower surfaces of the annular portions (first, second, third, fourth, and fifth annular portions) and the lower surfaces of the diameter portions (first, second, third, fourth diameter portions. A non-adhesive region 40 is also provided in various lower surface regions facing the various respective gaps 31, 32, 33, 34, and 35.

Certain effects of the third embodiment will be described. A structure with multiple annular portions and multiple diameter portions are formed with the first annular portion 11 to the fifth annular portion 19, and the first diameter portion 12 to the fourth diameter portion 18 are arranged in different directions as viewed from the center and extending directions are varied. Accordingly, the wafer 60 can be more uniformly supported by the base member 10 via the adhesive layer 20, and the supporting property and peeling off property are also good.

As viewed from the center, the first diameter portion 12 and the second diameter portions 14e, 14f are located in different directions, the second diameter portions 14e, 14f and the third diameter portions 16e, 16f are located in different directions, and the third diameter portions 16e, 16f and the fourth diameter portion 18 are located in different directions, so that stress generated on the wafer 60 can be dispersed.

Although radial lengths of the gaps 31, 32, 33, 34, and 35 are less than radial lengths of corresponding gaps according to the second embodiment, the trigger members 50 can still be used and inserted into the gaps 31 . . . 35 and the support substrate 103 can thus be peeled off.

Other configurations, operations, and effects according to the third embodiment are similar to those according to the first embodiment.

Fourth Embodiment

Figure 13:
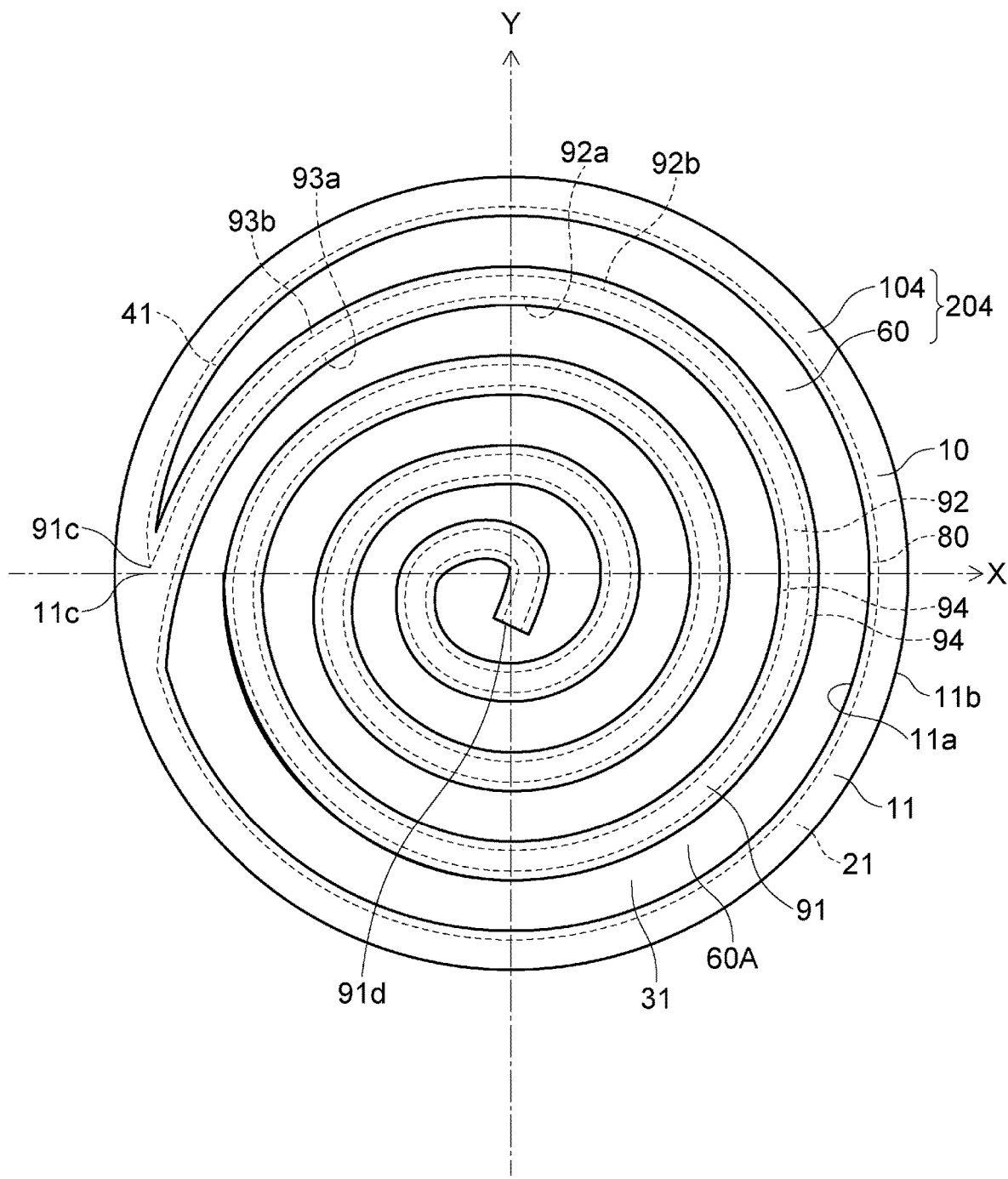
FIG. 13 is a plan view of a structure according to a fourth embodiment.

FIG. 13 is a plan view showing a structure of support substrate and wafer according to a fourth embodiment. As shown in FIG. 13, the base member 10 on a support substrate 104 according to the fourth embodiment includes a first annular portion 11 at an outermost periphery and a spiral portion 91 that is provided inside the first annular portion 11 and has a spiral shape.

The spiral portion 91 includes an outer end 91c which is an end on an outermost side and an inner end 91d which is an end on an innermost side. The spiral portion 91 has a spirals continuously inwardly from the outer end 91c in a clockwise direction in FIG. 13 to the inner end 91d. The outer end 91c which is at the inner edge surface 11a of the first annular portion 11 and is continuous with a coupling portion 11c. The inner end 91d is provided in the vicinity of the center of the first annular portion 11.

An inner surface 91a and an outer surface 91b of the spiral portion 91 likewise have a spiral shape from the outer end 91c in the clockwise direction, to a tip surface of the inner end 91d.

A gap 31 is provided inside the first annular portion 11. In the plan view, the gap 31 is formed where the spiral portion 91 is not provided. Specifically, one end of the gap 31 is a portion where the inner edge surface 11a of the first annular portion 11 is continuous with the outer surface 91b of the spiral portion 91. The gap 31 also has a spiral shape in the plan view gradually moving towards the center in the clockwise direction. The other end of the gap 31 surrounds the inner end 91d of the spiral portion 91. The gap 31 is provided between the inner edge surface 11a of the first annular portion 11 and the outer surface 91b of the spiral portion 91 and between the outer surface 91b and the inner surface 91a of the spiral portion 91. The upper surface 60A of the wafer 60 can be seen in the gap 31 that is opened on the upper surface 10A in a structure 204 in which the upper surface 60A of the wafer 60 is bonded to an adhesive layer 20 on the lower surface 10B of the base member 10.

The adhesive layer 21 is provided on the lower surface of the first annular portion 11 and an adhesive layer 92 is provided on a lower surface of the spiral portion 91.

The adhesive layer 21 provided on the lower surface of the first annular portion 11 has an annular shape. The adhesive layer 21 is continuous with the adhesive layer 92 on the spiral portion 91 on a lower surface of the coupling portion 11c.

The adhesive layer 21 includes the inner facing surface 21a and the outer facing surface 21b. The inner facing surface 21a faces the gap 31 and is slightly recessed from the inner edge surface 11a of the first annular portion 11. A non-adhesive region 41 is provided between the inner facing surface 21a of the adhesive layer 21 and the inner edge surface 11a of the first annular portion 11. That is, the non-adhesive region 41 is provided on a lower surface of an inner periphery of the first annular portion 11. The adhesive layer 21 in the vicinity of the coupling portion 11c lacks the non-adhesive region 41 and is continuous with the adhesive layer 92 on the spiral portion 91.

The outer facing surface 21b of the adhesive layer 21 is continuous with the outer edge surface 11b of the first annular portion 11 without separation therefrom, and lacks the non-adhesive region. That is, the non-adhesive region is not provided on a lower surface of an outer periphery of the first annular portion 11.

The adhesive layer 92 provided on the lower surface of the spiral portion 91 has a spiral shape. The adhesive layer 92 is continuous with the adhesive layer 21 on the first annular portion 11 on a lower surface of the outer end 91c.

An inner facing surface 92a of the adhesive layer 92 has a spiral shape in the plan view. The inner facing surface 92a faces the gap 31 and is slightly recessed from the inner surface 91a of the spiral portion 91. A non-adhesive region 93a is provided between the inner facing surface 92a of the adhesive layer 92 and the inner surface 91a of the spiral portion 91. One end of the inner facing surface 92a is continuous with the inner facing surface 21a of the adhesive layer 21 on the first annular portion 11 at the outer end 91c in a negative direction of a Y axis.

An outer facing surface 92b of the adhesive layer 92 has a spiral shape in the plan view. The outer facing surface 92b faces the gap 31 and is provided slightly inside the outer surface 91b of the spiral portion 91. A non-adhesive region 93b is provided between the outer facing surface 92b of the adhesive layer 92 and the outer surface 91b of the spiral portion 91. That is, the non-adhesive regions 93a and 93b are provided on both sides in a width direction of a lower surface of the spiral portion 91. One end of the outer facing surface 92b is continuous with the inner facing surface 21a of the adhesive layer 21 on the first annular portion 11 at the outer end 91c in a positive direction of the Y axis.

Next, a method for peeling off the support substrate 104 will be described. Similar to the first to third embodiments, a plurality of trigger members 50 are inserted, via the gap 31, into the space 80 between the non-adhesive region 41 on the first annular portion 11 and the upper surface 60A of the wafer 60 and a space 94 between the non-adhesive regions 93a, 93b on the spiral portion 91 and the upper surface 60A of the wafer 60. Similar to the first to third embodiments, a plurality of biasing members 70 may be appropriately provided on the upper surface 10A of the base member 10 to prevent the wafer 60 from being damaged by peeling off the upper surface 60A of the wafer 60 from surfaces of the adhesive layers 21 and 22 all at once.

Hereinafter, certain effects of the fourth embodiment will be described. The support substrate 104 according to the fourth embodiment includes the spiral portion 91 that is continuous with the inner surface of the first annular portion 11. Therefore, when the first annular portion 11 is peeled from the wafer 60, the spiral portion 91 is easily peeled from the outer end 91c side and the peeling off property is good. Since the inner facing surface 92a and the outer facing surface 92b of the adhesive layer 92 on the spiral portion 91 are continuous from the outer end 91c to the inner end 91d, length of a portion where the trigger member 50 can be inserted is large and workability is good. Since the number of turns of the spiral portion 91 may be increased by shortening radial length of the gap 31 or the spiral portion 91, both support property and peeling off property can be improved if desired. Even when the radial length of the gap 31 is shortened, the support substrate 104 can still be easily peeled off if a trigger member 50 is used.

Other configurations, operations, and effects according to the fourth embodiment are similar to those according to the first embodiment.

According to the various example embodiments described above, a support substrate that can be easily peeled off from a wafer, a method for peeling off the support substrate from the wafer, and a method for manufacturing a semiconductor device can be implemented.

Although the first to fourth embodiments are described above, the present disclosure is not limited thereto. For example, the base member 10 may have a structure with more annular portions than that depicted, a structure like a wheel or disk provided with the first annular portion 11 and a plurality of first diameter portions 12 that are provided inside the first annular portion 11 extending towards the center, or a mesh-like structure in which a plurality of horizontal and vertical members extend inside the first annular portion 11. Even in such cases, so long as a non-adhesive region that faces a gap is appropriately provided on a lower surface of the base member, a force that separates the non-adhesive region and the upper surface 60A of the wafer 60 can be applied by inserting a trigger member 50 from the gap side facing a portion where the non-adhesive region has been provided, and the support substrate can thus be peeled off in the disclosed manner.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A support substrate for bonding to a semiconductor wafer, comprising:
   a base member having a disk shape with a gap region within the outermost edge of the base member and including at least one gap that penetrates through the base member in a thickness direction of the base member; and
   an adhesive layer on a lower surface of the base member, the adhesive layer extending to the outermost edge of the base member in a radial direction, wherein
   the adhesive layer does not cover any portion of the lower surface of the base member directly adjacent to the at least one gap.

2. The support substrate according to claim 1, wherein the base member includes:
   a first annular portion that has an inner surface facing the at least one gap,
   a first portion that extends in the radial direction from the inner surface of the first annular portion towards the center of base member,
   a second annular portion spaced from the first annular portion in the radial direction closer to the center of the base member than the first annular portion, and
   the first portion connects the first annular portion to the second annular portion.

3. The support substrate according to claim 1 wherein the at least one gap spirals inwardly in the radial direction to a central region of the base member.

4. The support substrate according to claim 1, further comprising:
   a plurality of gaps in the gap region, wherein
   the adhesive layer does not cover any portion of the lower surface of the base member directly adjacent to any of the plurality of gaps.

5. The support substrate according to claim 4, wherein
   the plurality of gaps includes a first group of gaps at a first distance in the radial direction from the outermost edge of the base member and a second group of gaps at a second distance in the radial direction from the outermost edge of the base member,
   the second distance is greater than the first distance.

6. The support substrate according to claim 5, wherein
the gaps of the first group of gaps are all the same shape and size as one another, and
the gaps of the second group of gaps are all the same shape and size as one another.

7. The support substrate according to claim 5, wherein
the base member includes a first annular portion including the outermost edge of the base member and a second annular portion spaced from the first annual portion in the radial direction,
the first group of gaps is between the first annular portion and the second annular portion in the radial direction,
the second group of gaps is between the second annular portion and the central portion of the base member, and
a plurality of radial portions of the base member extend in the radial direction from the first annular to the central portion of the base member.

8. The support substrate according to claim 7, wherein the plurality of radial portions meet at the center of the base member.

9. The support substrate according to claim 4, wherein the base member includes:
a first annular portion including the outermost edge of the base member
a second annular portion between the first annular portion and the center of the base member in the radial direction, and
a third annular portion between the second annular portion and the center of the base member in the radial direction, and
the plurality of gaps includes:
a first group of gaps between the first annular portion and the second annular portion in the radial direction, the gaps of the first group being spaced from each other in a circumferential direction of the base member,
a second group of gaps between the second annular portion and the third annular portion, the gaps of the second group being spaced from each other in the circumferential direction, and
a third group of gaps between the third annular portion and the center of the base member in the radial direction, the gaps of the third group being spaced from each other in the circumferential direction.

10. The support substrate according to claim 9, wherein the base member includes:
a plurality of first portions connecting the first annular portion to the second annular portion, and
a plurality of second portions connecting the second annular portion to the third annular portion.

11. The support substrate according to claim 10, wherein each first portion is aligned with a second portion along the radial direction.

12. The support substrate according to claim 10, wherein the first portions do not align with the second portions along the radial direction.

13. The support substrate according to claim 10, wherein at least one of the second portions extends at an angle to the radial direction.

14. The support substrate according to claim 1, wherein the at least one gap is at the center of the base member.

15. The support substrate according to claim 1, wherein the base member comprises one of polyethylene terephthalate, glass epoxy, carbon epoxy, and glass fiber.

* * * * *